(12) United States Patent
Nieh et al.

(10) Patent No.: US 10,128,115 B2
(45) Date of Patent: Nov. 13, 2018

(54) METHOD OF FORMING ULTRA-SHALLOW JUNCTIONS IN SEMICONDUCTOR DEVICES

(75) Inventors: Chun-Feng Nieh, Hsinchu (TW); Mao-Rong Yeh, Tao Yuan (TW); Chun Hsiung Tsai, Xinpu Township (TW); Chii-Ming Wu, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 632 days.

(21) Appl. No.: 12/713,356

(22) Filed: Feb. 26, 2010

(65) Prior Publication Data
US 2011/0212592 A1    Sep. 1, 2011

(51) Int. Cl.
| | | |
|---|---|---|
| *H01L 21/00* | (2006.01) | |
| *H01L 21/265* | (2006.01) | |
| *H01L 21/8238* | (2006.01) | |
| *H01L 29/66* | (2006.01) | |
| *H01L 29/10* | (2006.01) | |

(52) U.S. Cl.
CPC .. *H01L 21/26513* (2013.01); *H01L 21/26506* (2013.01); *H01L 21/26586* (2013.01); *H01L 21/26593* (2013.01); *H01L 21/823814* (2013.01); *H01L 29/6659* (2013.01); *H01L 29/1083* (2013.01)

(58) Field of Classification Search
CPC ......... H01L 21/26513; H01L 21/26506; H01L 21/823814; H01L 29/6659
USPC ...................................... 438/229, 199
See application file for complete search history.

(56) References Cited

U.S. PATENT DOCUMENTS

| | | | |
|---|---|---|---|
| 5,212,101 A * | 5/1993 | Canham | H01L 21/26506 |
| | | | 148/DIG. 155 |
| 6,030,869 A | 2/2000 | Odake et al. | |
| 6,344,396 B1 * | 2/2002 | Ishida | H01L 29/6653 |
| | | | 257/E21.427 |
| 7,678,637 B2 * | 3/2010 | Nandakumar | H01L 21/26506 |
| | | | 438/199 |
| 7,745,292 B2 * | 6/2010 | Lian | H01L 21/26506 |
| | | | 257/E21.632 |
| 7,795,679 B2 * | 9/2010 | Cannon | H01L 29/0653 |
| | | | 257/288 |
| 8,012,843 B2 * | 9/2011 | Hatem | H01L 21/2236 |
| | | | 438/372 |
| 2005/0112835 A1 | 5/2005 | Sa | |
| 2008/0128806 A1 * | 6/2008 | Liu et al. | 257/347 |
| 2009/0081836 A1 * | 3/2009 | Liu et al. | 438/229 |
| 2011/0034013 A1 | 2/2011 | Hatem et al. | |

\* cited by examiner

*Primary Examiner* — Julio J Maldonado
*Assistant Examiner* — Andre' C Stevenson
(74) *Attorney, Agent, or Firm* — Hauptman Ham, LLP

(57) ABSTRACT

A method of forming MOS transistor includes the steps of performing a pocket implantation process on a substrate having a gate stack, performing a co-implanted ion implantation process on the substrate at a temperature less than room temperature, performing a lightly doped source/drain implantation process on the substrate, and forming source and drain regions in the substrate, adjacent the gate stack.

20 Claims, 9 Drawing Sheets

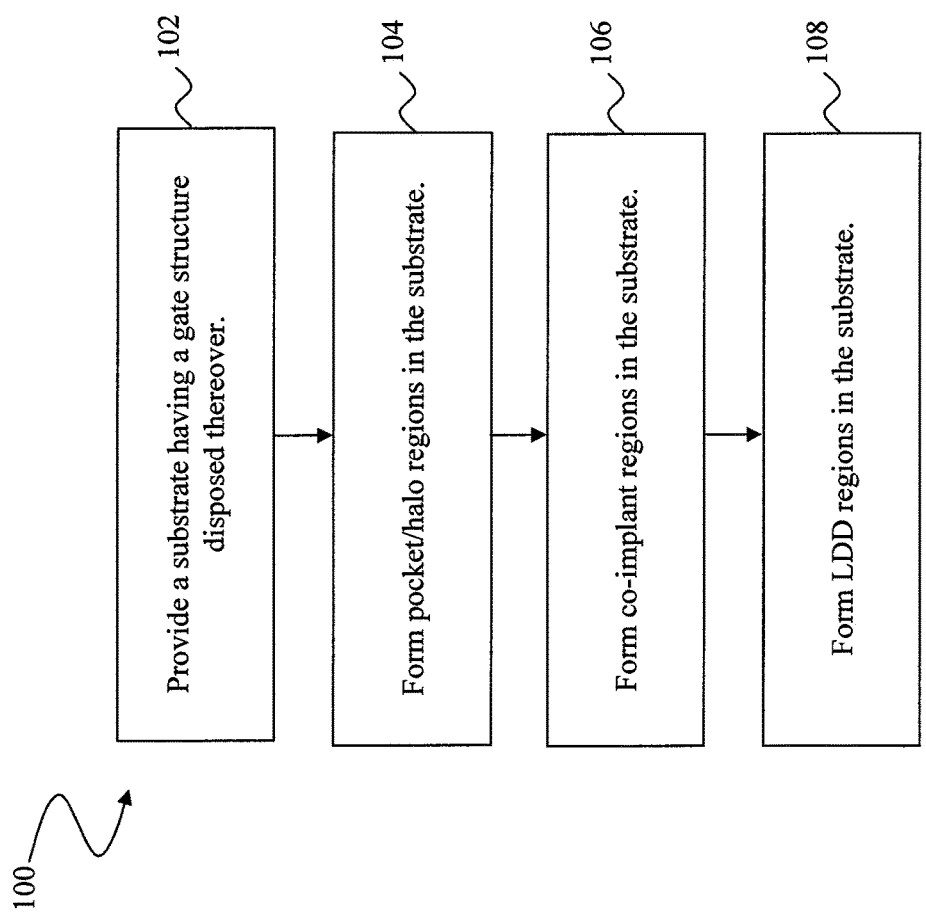

METHOD OF FORMING ULTRA-SHALLOW JUNCTIONS IN SEMICONDUCTOR DEVICES

RELATED APPLICATIONS

The present disclosure is related to the following commonly-assigned U.S. patent applications, the entire disclosures of which are incorporated herein by reference: U.S. application Ser. No. 12/616,406 or "METHOD FOR OBTAINING QUALITY ULTRA-SHALLOW DOPED REGIONS AND DEVICE HAVING SAME".

TECHNICAL FIELD

This invention is related generally to semiconductor devices, and more particularly to the formation of Metal-Oxide Semiconductor (MOS) devices with ultra-shallow junctions.

BACKGROUND

As the dimensions of transistors are scaled down, the reduction of vertical junction depth and the suppression of dopant lateral diffusion, in order to control short-channel effects, become greater challenges. MOS devices have become so small that the diffusion of impurities from lightly doped source/drain (LDD) regions and source/drain regions will significantly affect the characteristics of the MOS devices. Particularly, impurities from LDD regions are readily diffused into the channel region, causing short channel effects and leakage currents between the source and drain regions.

Typically, when LDD regions are formed in a semiconductor substrate by ion implantation, the junction depth is not just dependent on the ion implant energy but can also depend on channeling and phenomena such as transient enhanced diffusion (TED) when the implanted ions migrate through the crystal lattice during subsequent thermal processing. Current techniques for forming ultra-shallow doped regions, such as p-type LDD (PLDD) regions in PMOS devices and n-type LDD (NLDD) regions in NOMS devices, use pre-amorphisation techniques to amorphise the semiconductor substrate (i.e., turn a portion of the crystalline silicon substrate into amorphous silicon) by, for example, ion implantation using non-electrically active ions, such as silicon, germanium and fluorine, in order to eliminate channeling. The pre-amorphization implantation creates in the substrate an amorphous surface layer adjacent to the underlying crystalline semiconductor material and produces a large number of defects beyond the amorphous/crystalline interface. These crystal defects are usually called End of Range (EOR) defects. Defects of this kind are known to enhance diffusion of previously implanted dopant ions during subsequent thermal processes of annealing and activation of the semiconductor device.

Methods for preventing the above-described EOR defects and controlling the diffusion of implanted dopants are thus explored.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 1 is a flow chart of a method of fabricating a semiconductor device having ultra-shallow junctions according to various aspects of the present disclosure.

DETAILED DESCRIPTION

In the creation of ultra-shallow junctions in Complementary Metal-Oxide Semiconductor (CMOS) manufacturing, special attention is not only given to forming the doped regions of source/drain (S/D), but also focusing on the formation of lightly doped source/drain (LDD) regions. To date, boron is the one candidate for p-type dopant that has a high enough solid solubility to form the doped regions with the required electrical conductivity. However boron will diffuse rapidly in the silicon substrate during the high temperature anneal ("activation") cycle that is required to process the wafers. This anomalous boron diffusion, transient enhanced diffusion (TED), limits the attainable parameters, in particular the abruptness of the p-n junction, particularly that of the PLDD regions. TED is believed to be mediated (detrimentally increased) by defects created in the silicon during the implantation process, as discussed above.

With reference to FIGS. 1 and 2A-2H, a method 100 and a semiconductor device 200 are collectively described below. The semiconductor device 200 illustrates an integrated circuit, or portion thereof, that can comprise memory cells and/or logic circuits. In some embodiments, the semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors, other suitable components, and/or combinations thereof. It is understood that additional steps can be provided before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2A:
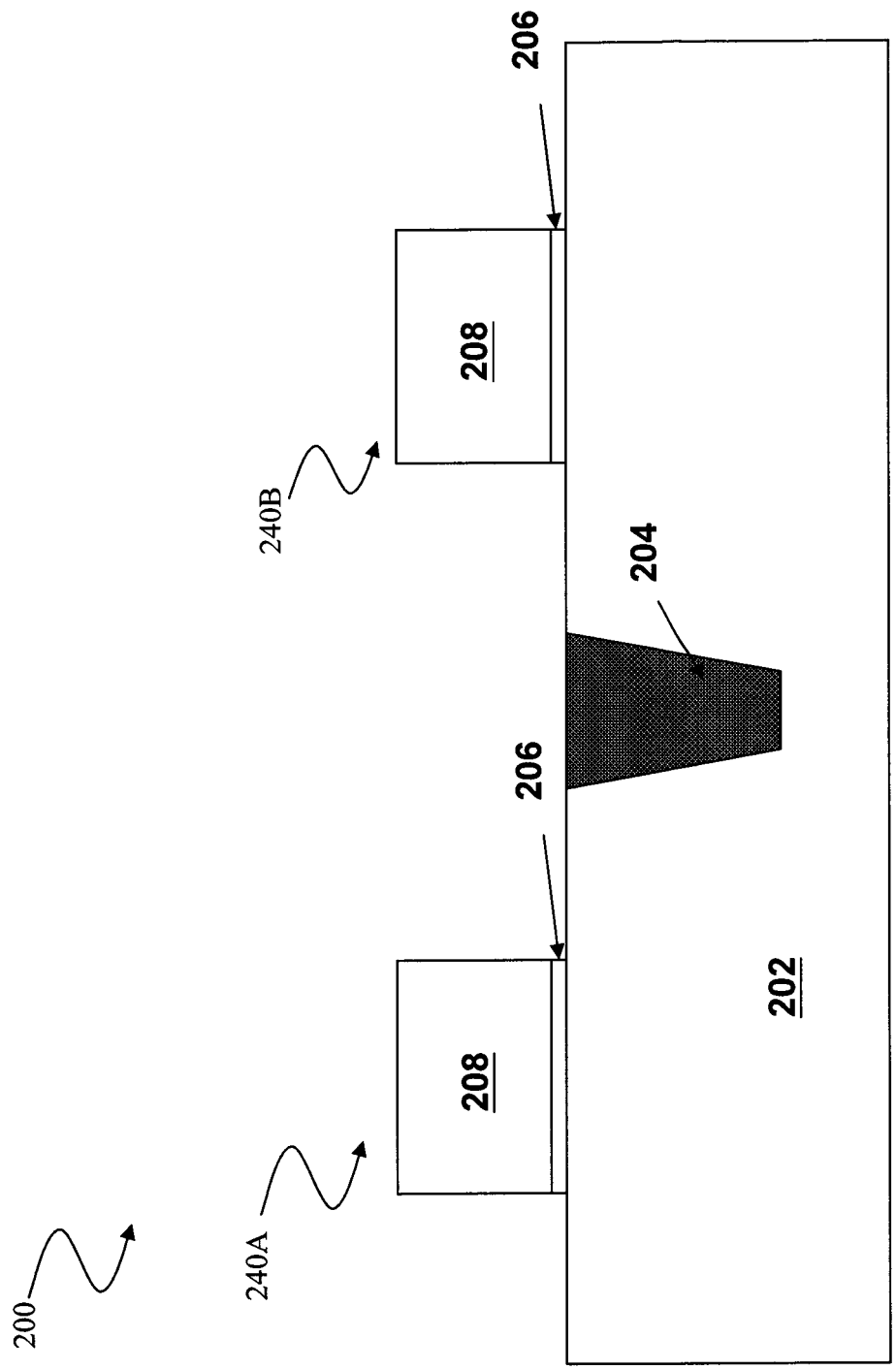
FIGS. 2A-2H are cross-sectional views of an embodiment of a semiconductor device at various stages of fabrication according to the method of FIG. 1.

Referring to FIGS. 1 and 2A, the method 100 begins at block 102 wherein a substrate 202 is provided. In the present embodiment, the substrate 202 is a semiconductor substrate comprising silicon. In alternative embodiments, the substrate 202 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, in at least one embodiment, the semiconductor substrate may be a semiconductor on insulator (SOI). In some examples, the semiconductor substrate may include a doped epi layer. In other examples, the silicon substrate may include a multilayer compound semiconductor structure.

An exemplary isolation region 204 is formed in the substrate 202 to isolate various regions of the substrate 202, and, in the present embodiment for example, to isolate a PMOS device 240A and a NMOS device 240B. The isolation region 204 utilizes isolation technology, such as local oxidation of silicon (LOCOS) or shallow trench isolation (STI), to define and electrically isolate the various regions. In the present embodiment, the isolation region 204 includes a STI. In some embodiments, the isolation region 204 comprises silicon oxide, silicon nitride, silicon oxynitride, other suitable materials, or combinations thereof. The isolation region 204 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. In some examples, the filled trench may have a multi-layer structure such as a thermal oxide liner layer filled with silicon nitride or silicon oxide.

A material layer is formed over the substrate 202. The material layer includes one or more material layers comprising any suitable material and thickness. In some embodiments, the material layer can include interfacial layers, capping layers, diffusion/barrier layers, dielectric layers, high-k dielectric layers, conductive layers, gate layers, liner layers, seed layers, adhesion layers, other suitable layers, and/or combinations thereof. The material layer is formed by any suitable process including chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD), plating, other suitable methods, and/or combinations thereof. In some embodiments, the semiconductor device 200 may include one or more antireflective coating layers, such as a top antireflective coating layer and/or a bottom antireflective coating layer.

In one embodiment, the material layer includes a gate dielectric layer and a gate electrode layer. The gate dielectric layer is formed over the substrate 202 by any suitable process to any suitable thickness. The gate dielectric layer, for example, is silicon oxide, silicon oxynitride, silicon nitride, spin-on glass (SOG), fluorinated silica glass (FSG), carbon doped silicon oxide, Black Diamond® (Applied Materials of Santa Clara, Calif.), Xerogel, Aerogel, amorphous fluorinated carbon, Parlyene, BCB (bis-benzocyclobutenes), SiLK (Dow Chemical, Midland, Mich.), polyimide, other suitable dielectric materials, or combinations thereof. The gate dielectric layer may comprise a high-k dielectric material, such as $HfO_2$, HfSiO, HfSiON, HfTaO, HfTiO, HfZrO, other suitable high-k dielectric materials, and/or combinations thereof. The gate dielectric layer can further include an interfacial layer, which comprises a grown silicon oxide layer (e.g., thermal oxide or chemical oxide) or silicon oxynitride (SiON).

The gate electrode layer is formed over the gate dielectric layer by any suitable process to any suitable thickness. In the present embodiment, the gate electrode layer is a polysilicon layer. The polysilicon (or poly) layer is formed by CVD or other suitable deposition process. For example, silane ($SiH_4$) may be used as a chemical gas in the CVD process to form the gate electrode layer.

The gate electrode layer may include a thickness ranging from about 400 to about 800 angstrom (Å). The gate electrode layer and the gate dielectric layer are then patterned to form gate structures of the PMOS 240A and the NMOS 240B. Each of the PMOS 240A and the NMOS 240B comprises the gate structure with a gate electrode 208 overlying a gate dielectric 206. In another embodiment, the gate electrode 208 and/or the gate dielectric 206 may be sacrificial layers and will be removed by a replacement step after the gate patterning process.

Figure 2B:
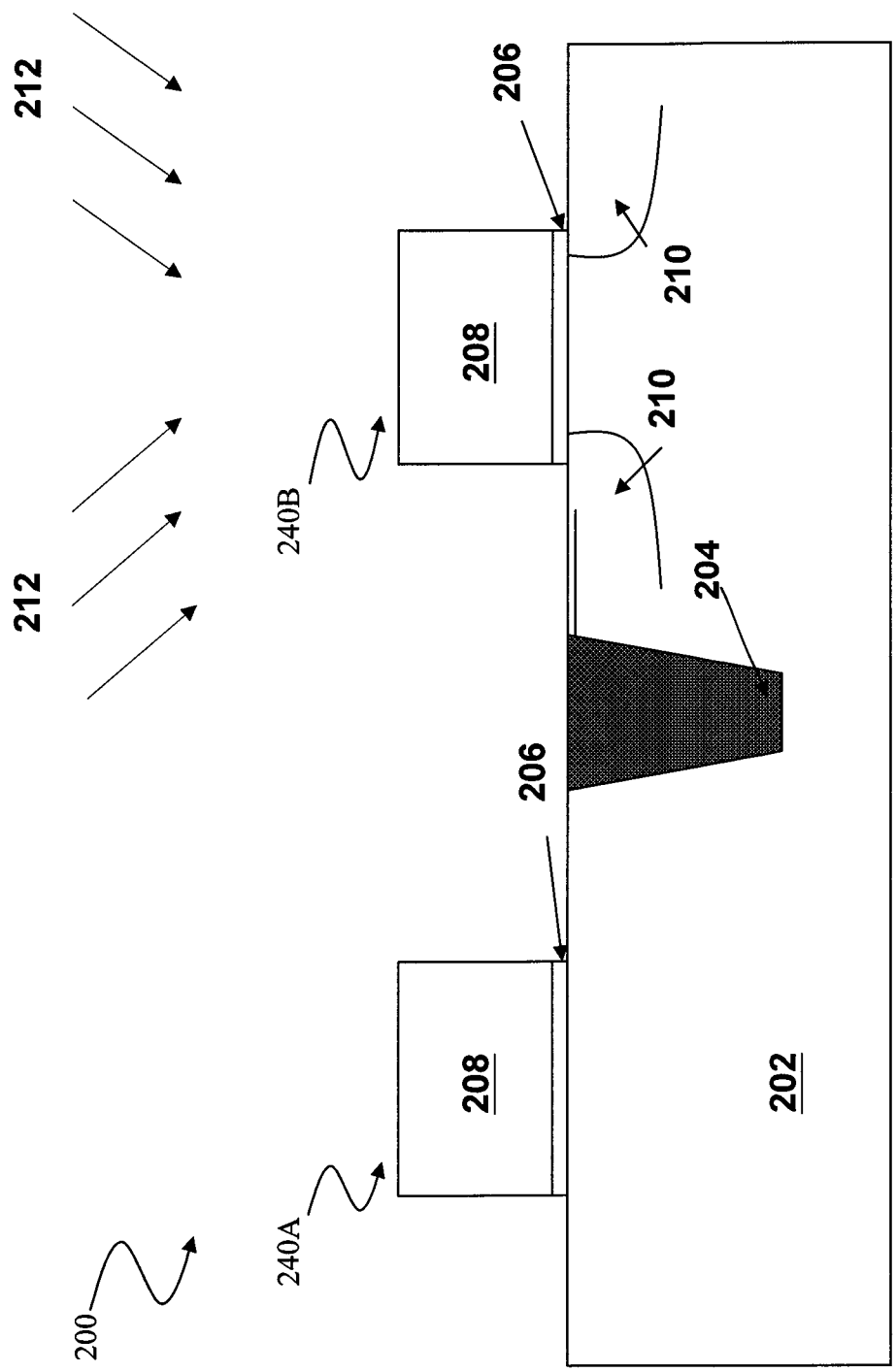

Referring to FIGS. 1 and 2B, the method 100 continues with block 104 in which pocket/halo regions 210 are formed in the NMOS device 240B. The pocket/halo regions 210 are formed by an ion implantation process 212 to introduce p-type dopants, such as boron, into the substrate 202. In some embodiments, the ion implantation process 212 is preferably preformed by a tilt implant process at a tilt angle ranging between about 0 degrees and about 60 degrees. In one embodiment, the ion implantation process 212 is performed at an energy ranging between about 10 KeV and about 100 KeV. In another embodiment, the ion implantation process 212 is performed with a dopant dosage ranging between about 1E13 atoms/$cm^2$ and about 1E15 atoms/$cm^2$. In yet another embodiment, the ion implantation process 212 is performed at a temperature not less than room temperature (room temperature being about 20° C. to 25° C.). In some embodiments, the pocket/halo regions 210 may be partially under edges of the gate structure of NMOS device 240B because of the tilt implant process. As is known in the art, more than one implantation may be conducted to form pocket/halo regions 210 in desired regions. In at least one embodiment, p-type pocket/halo regions 210 are preferably located around the side borders and junction of the subsequently formed source/drain regions (including LDD regions) to neutralize the diffusion of the n-type impurities.

Figure 2C:
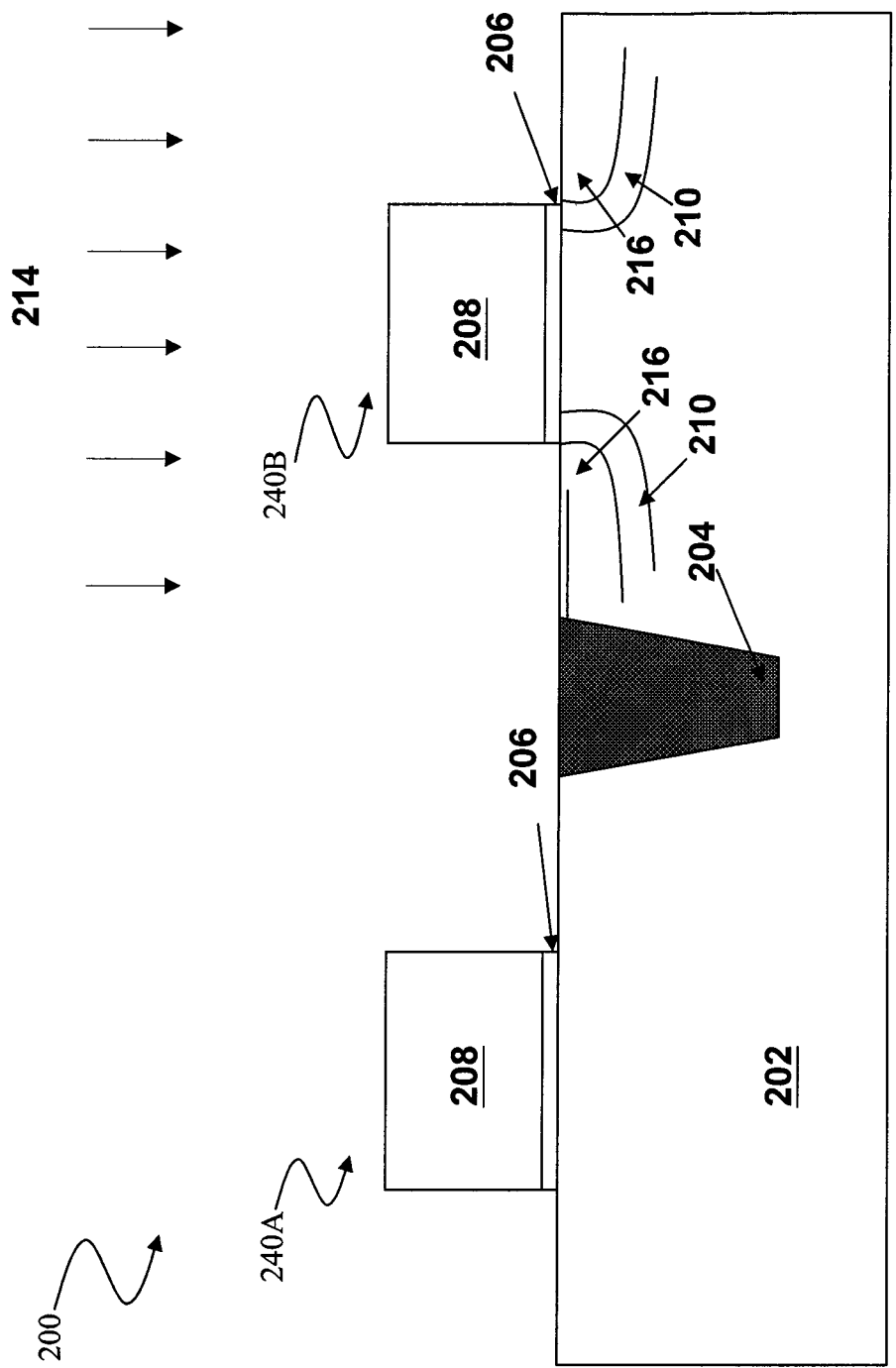
Figure 2D:
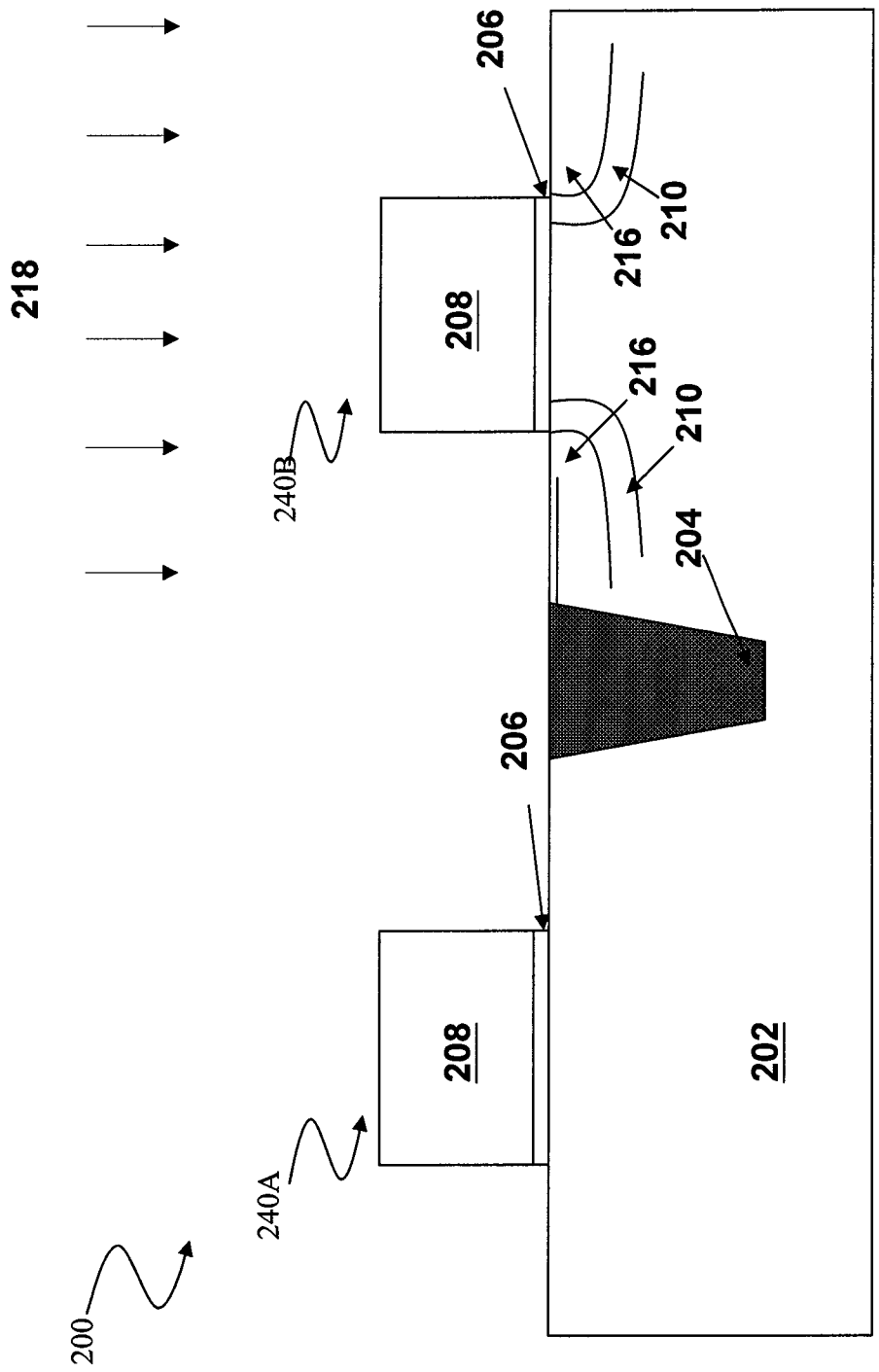

Referring to FIGS. 2C and 2D, a co-implanted ion implantation process 214 and a lightly doped source/drain (LDD) implantation process 218 are then provided to the NMOS 240B to form n-type lightly doped source/drain (NLDD) regions 216 within the pocket/halo regions 210. Referring to FIGS. 1 and 2C, the method 100 continues with block 106 in which the co-implanted ion implantation process 214 is performed to introduce dopants, such as nitrogen and/or fluorine, in the to-be-formed n-type lightly doped source/drain (NLDD) regions 216. The co-implanted ion implantation process 214 may result a trapping layer (not shown) in the substrate 202 to prevent interstitial back flow in the NMOS device 240B.

In one embodiment, the co-implanted ion implantation 214 is preferably preformed by an implant process at a tilt angle ranging about 0 degrees and about 60 degrees. In another embodiment, the ion implantation process is performed at energy ranging between about 1 and about 20 KeV. In yet another embodiment, the ion implantation process is performed with a dopant dosage ranging between about 5E14 atoms/$cm^2$ and about 2E15 atoms/$cm^2$. The co-implanted ion implantation process 214, for example, is conducted at a low temperature such as at a temperature less than room temperature in some embodiments, to form amorphous regions (not shown) and co-implantation regions (not shown) within the to-be-formed NLDD regions 216. In another embodiment, the co-implanted ion implantation process 214 is performed at a temperature ranging between about −100° C. and about 0° C. by adapting a Cyro (low temperature) function in the ion implanter.

Low temperature co-implanted ion implantation process may form amorphous regions, hence it is not necessary to apply a pre-amorphization implantation process to the substrate. Therefore, the process flow for device fabrication may be accordingly simplified. In addition, the formation of a large number of defects from the step of pre-amorphization implantation could be prevented and the device performance could be enhanced.

Referring to FIGS. 1 and 2D, the method 100 continues with block 108 in which the lightly doped source/drain (LDD) implantation process 218 is provided to the NMOS 240B to introduce n-type dopants, such as phosphor or arsenic, to form the NLDD regions 216. The LDD implantation process 218 is preferably preformed by an ion implant process at a tilt angle ranging between about 0 degrees and about 30 degrees. In one embodiment, the LDD implantation process 218 is performed at energy ranging between about 1 KeV and about 10 KeV. In another embodiment, the LDD implantation process 218 is performed with a dopant dosage ranging between about 5E14 atoms/cm$^2$ and about 2E15 atoms/cm$^2$. In at least one embodiment, the ion implantation process 218 is performed at a temperature not less than room temperature.

Nitrogen and/or fluorine, introduced by the co-implanted ion implantation 214, have the function of retarding the diffusion of other dopants. Therefore, the diffusion of the dopants introduced by the LDD implantation 218 is controlled when the MOS devices are annealed, and thus the NLDD regions 216 have higher impurity concentrations and more confined profiles for forming the ultra-shallow junction.

Furthermore, it is understood that the PMOS device 240A may be protected by a patterned photoresist or other suitable protection pattern during the above-described implantation processes provided to the NMOS device 240B.

Figure 2E:
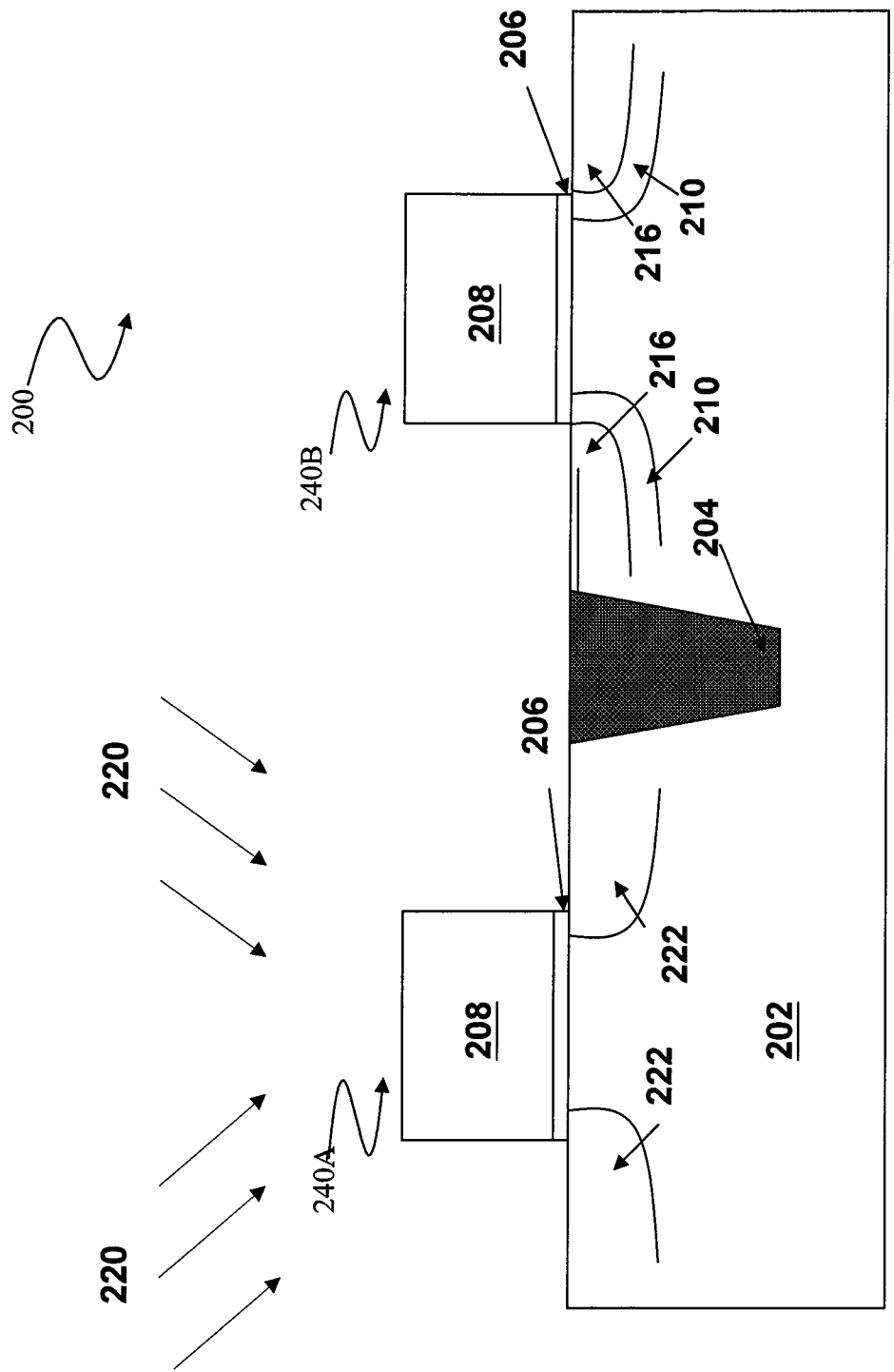
Figure 2F:
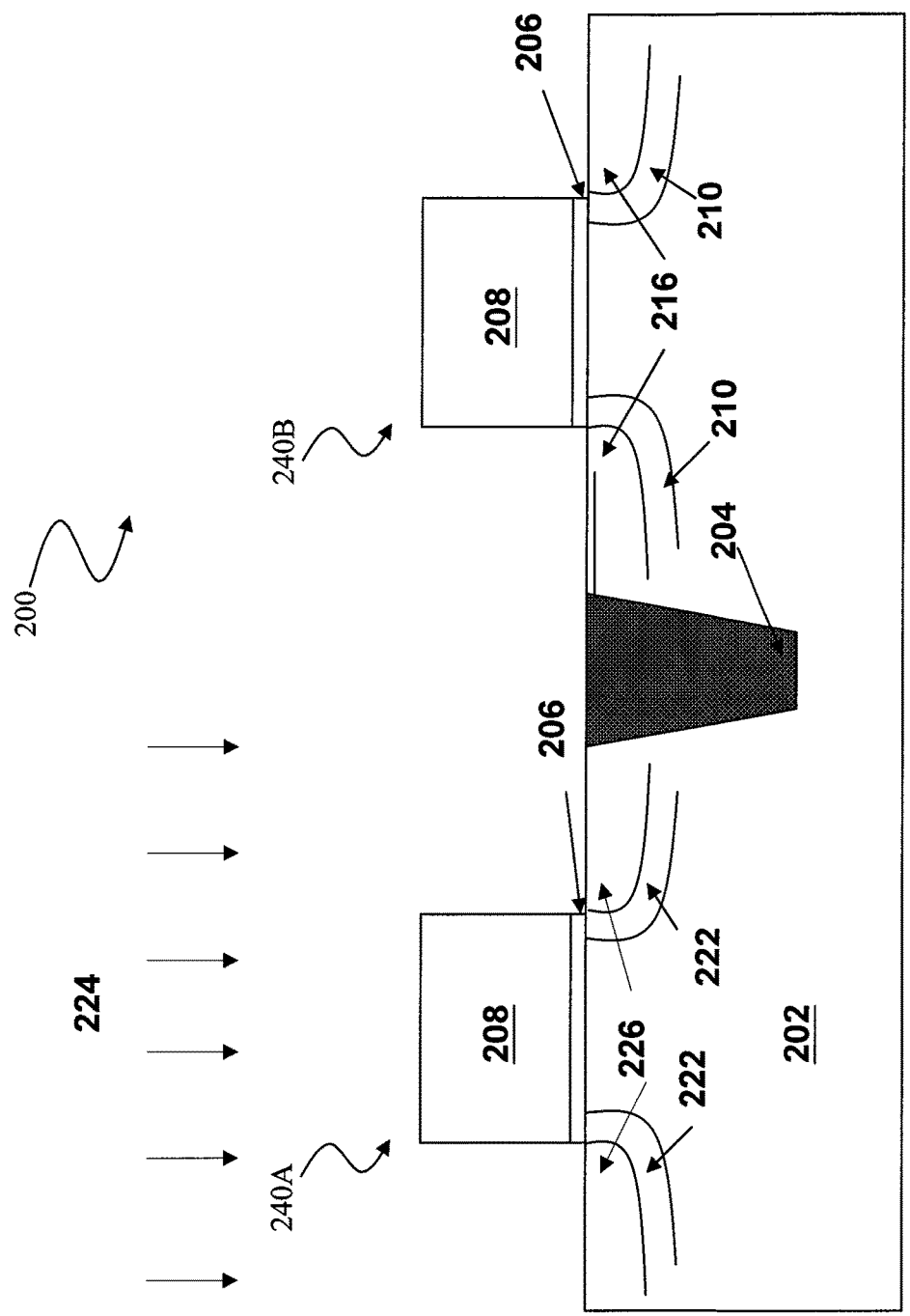
Figure 2G:
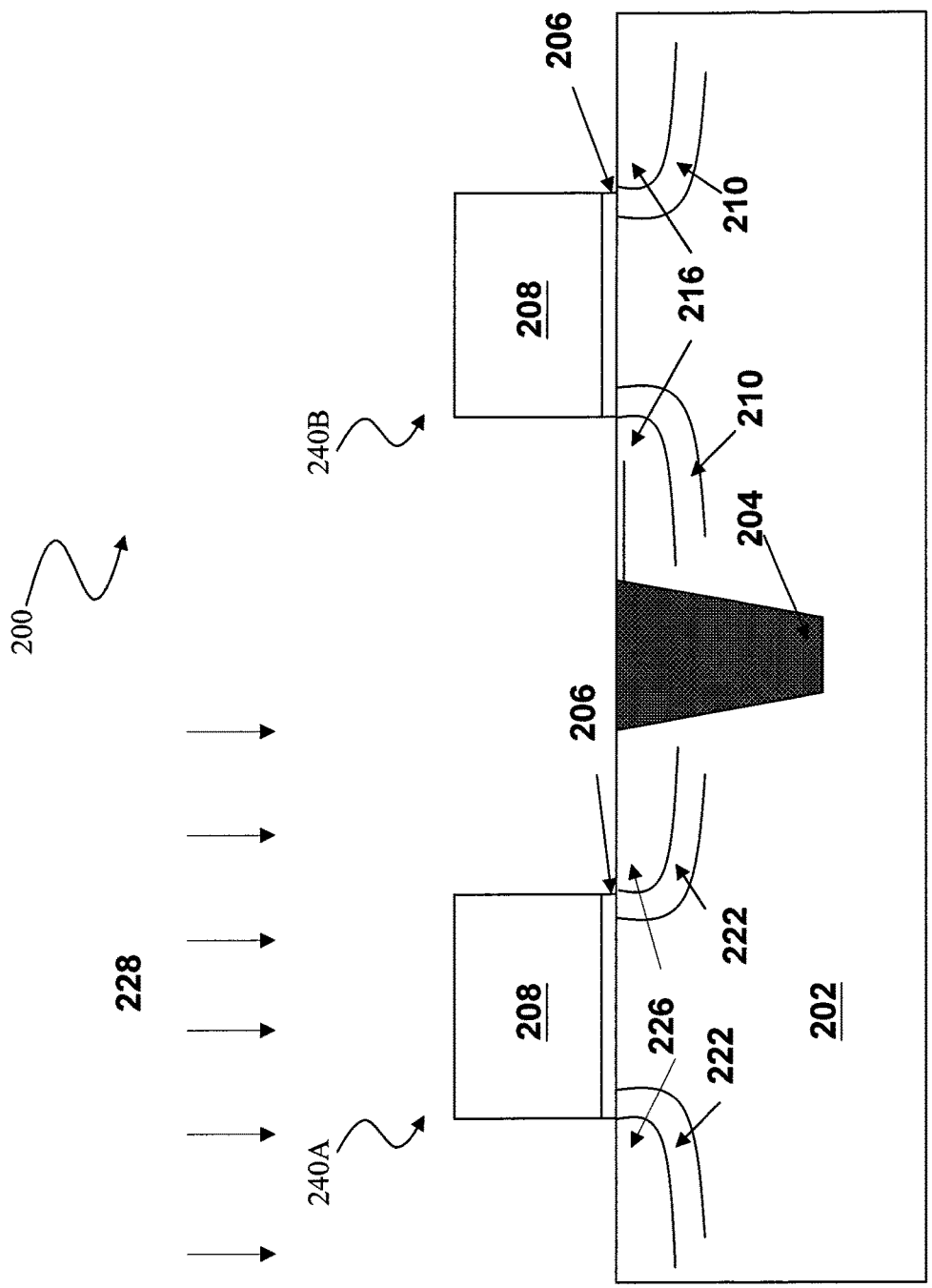

FIGS. 2E-2G illustrate ion implantation processes to the PMOS device 240A. Steps as explained in FIG. 1 apply to the formation of the PMOS device 240A as well. Referring to FIG. 2E, pocket/halo regions 222 are formed in the substrate 202 (Step 104). The pocket/halo regions 222 are formed by an ion implantation process 220 to introduce n-type dopants, such as phosphor or arsenic, into the substrate 202. The pocket/halo regions 222 are preferably preformed by a tilt implant process at a tilt angle ranging about 0 degrees and about 60 degrees. In one embodiment, the ion implantation process 220 is performed at energy ranging between about 10 KeV and about 100 KeV. In another embodiment, the ion implantation process 220 is performed with a dopant dosage ranging between about 1E13 atoms/cm$^2$ and about 1E15 atoms/cm$^2$. In yet another embodiment, the ion implantation process 220 is performed at a temperature not less than room temperature. In some embodiments, the pocket/halo regions 222 may be partially under edges of the gate structure of PMOS device 240A because of the tilt implant process. As is known in the art, more than one implantation may be conducted to form pocket/halo regions 222 in desired regions. In at least one embodiment, n-type pocket/halo regions 222 are preferably located around the side borders and junction of the subsequently formed source/drain regions (including LDD regions) to neutralize the diffusion of the p-type impurities.

Referring to FIGS. 2F and 2G, a co-implanted ion implantation process 224 and a lightly doped source/drain (LDD) implantation process 228 are provided to the PMOS 240A to form p-type lightly doped source/drain (PLDD) regions 226 within the pocket/halo regions 222. Referring to FIG. 2F, the co-implanted ion implantation 224 process is performed to introduce dopants (Step 106), such as nitrogen and/or carbon, in the to-be-formed PLDD regions 226. The co-implanted ion implantation process 224 may result a trapping layer (not shown) in the substrate 202 to prevent interstitial back flow in the PMOS device 240A.

In one embodiment, the co-implanted ion implantation process 224 is preferably preformed by an ion implant process at a tilt angle ranging about 0 degrees and about 60 degrees. In another embodiment, the ion implantation process is performed at energy ranging between about 1 KeV and about 20 KeV. In yet another embodiment, the ion implantation process is performed with a dopant dosage ranging between about 5E14 atoms/cm$^2$ and about 2E15 atoms/cm$^2$. In some embodiments, the co-implanted ion implantation process 224 is preformed at a low temperature for pre-amorphization and co-implantation formation. In some embodiments, the term "low temperature" refers to a temperature lower than room temperature, and preferably between about $-100°$ C. and about $0°$ C. The co-implanted ion implantation process 224, for example, is conducted at a low temperature to form amorphous regions (not shown) and co-implantation regions (not shown) within the to-be-formed PLDD regions 226. In one embodiment, the co-implanted ion implantation process 224 is performed at a temperature less than room temperature. In another embodiment, the co-implanted ion implantation process 224 is performed at a temperature ranging between about $-100°$ C. and about $0°$ C. by adapting a Cyro (low temperature) function in the ion implanter.

Low temperature co-implanted ion implantation process may form amorphous regions, hence it is not necessary to apply a pre-amorphization implantation process to the substrate. Therefore, the process flow for device fabrication may be accordingly simplified. In addition, the formation of a large number of defects from the step of pre-amorphization implantation could be prevented and the device performance could be enhanced.

Referring to FIG. 2G, a lightly doped source/drain (LDD) implantation process 228 is performed to introduce p-type dopants, such as boron, to form the PLDD regions 226. The LDD implantation process 228 is preferably preformed by an ion implant process at a tilt angle ranging between about 0 degrees and about 30 degrees. In one embodiment, the LDD implantation process 228 is performed at energy ranging between about 1 KeV and about 10 KeV. In another embodiment, the LDD implantation process 228 is performed with a dopant dosage ranging between about 5E14 atoms/cm$^2$ and about 2E15 atoms/cm$^2$. In at least one embodiment, the LDD implantation process 228 is performed at a temperature not less than room temperature.

Nitrogen, Fluorine and/or carbon, introduced by the co-implanted ion implantation process 228, have the function of retarding the diffusion of other dopants. Therefore, the diffusion of the dopants introduced by the LDD implantation process 228 is controlled when the MOS devices are annealed, and thus the PLDD regions 226 have higher impurity concentrations and more confined profiles for forming the ultra-shallow junction.

Furthermore, it is also understood that the NMOS device 240B may be protected by a patterned photoresist or other suitable protection pattern during the above-described implantation processes provided to the PMOS device 240A.

Figure 2H:
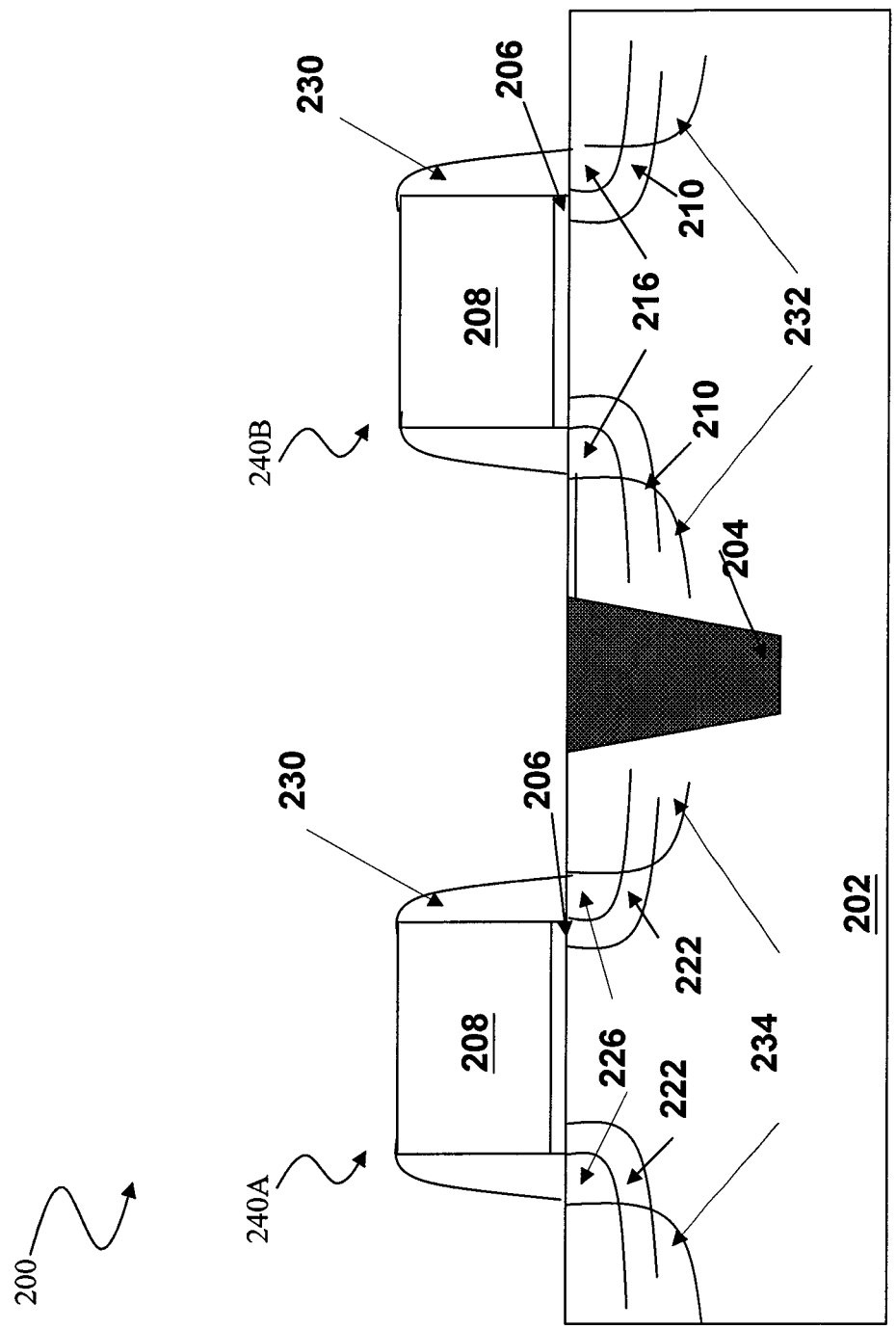

In some embodiments, spacers 230 are then formed as shown in FIG. 2H. Thereafter, source/drain (S/D) regions 234, 232 may be formed in the substrate 202 by conventional implantation processes. One or more thermal processes, such as rapid thermal anneal (RTA), may also be provided on the substrate 202 to activate the dopants in the S/D regions. The formation details are well known in the art, thus are not repeated herein.

Subsequent processing in some embodiments may implement a gate replacement process. For example, metal gates may replace the gate electrode 208 (i.e., polysilicon gate layer) of the gate structures of the PMOS/ NMOS devices 240A/240B. A first metal gate having a first work function may be formed in the gate structure of the NMOS devices 240B and a second gate structure having a second work function may be formed in the gate structure of the PMOS devices 240A. The metal gates may comprise any suitable material including aluminum, copper, tungsten, titanium, tantulum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

In some embodiments, the pre-amorphized implantations for reducing the dopant channeling effect and enhancing dopant activation can be omitted by adapting the low-temperature co-implanted ion implantation. Hence, End of Range (EOR) defects caused by the pre-amorphized implantations will not be introduced in the LDD regions and ultra-shallow LDD regions with more precisely controlled implanted dopant are achieved.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A method, comprising:
forming, by a pocket implantation process on a substrate having a gate stack, a pocket implant region in the substrate;
forming a lightly-doped source/drain (LDD) region in the pocket implant region by:
performing a co-implanted ion implantation process with a diffusion-reducing species at a temperature less than room temperature and without performing a pre-amorphisation implantation process, to form an amorphous region, and
performing a lightly doped source/drain implantation process into the amorphous region; and
performing a source/drain implantation process into the amorphous region and the pocket implant region following completion of the lightly doped source/drain implantation process.

2. The method of claim 1, wherein no pre-amorphisation implantation process is performed before or after the pocket implantation process or the lightly doped source/drain implantation process.

3. The method of claim 1, wherein the pocket implantation process is performed at a temperature not less than room temperature.

4. The method of claim 1, wherein the co-implanted ion implantation process is performed at a temperature ranging between about −100° C. and about 0° C.

5. The method of claim 1, wherein the lightly doped source/drain implantation process is performed at a temperature not less than room temperature.

6. The method of claim 1, wherein the diffusion-reducing species comprises nitrogen, fluorine, carbon, or combinations thereof.

7. The method of claim 1, further comprising after completion of the lightly doped source/drain implantation process,
forming spacers adjacent to the gate stack.

8. The method of claim 1, wherein the co-implanted ion implantation process is performed by an ion implanter with a Cyro function.

9. A method of forming MOS transistors, the method comprising:
forming, by a pocket implantation process on a substrate having a gate stack and free of a pre-amorphisation implant, a pocket implantation region in the substrate;
performing a co-implanted ion implantation process with a diffusion-blocking dopant on the substrate at a temperature less than about 0° C. to form an amorphous region within the pocket implantation region of the substrate;
performing a lightly doped source/drain implantation process on the amorphous region; and
performing a source/drain implantation process following completion of the lightly doped source/drain implantation process.

10. The method of claim 9, wherein no pre-amorphisation implantation process is performed before or after the pocket implantation process or the lightly doped source/drain implantation process.

11. The method of claim 9, wherein the pocket implantation process is performed at a temperature not less than room temperature.

12. The method of claim 9, wherein the co-implanted ion implantation process is performed at a temperature not less than about −100° C.

13. The method of claim 9, wherein the lightly doped source/drain implantation process is performed at a temperature not less than room temperature.

14. The method of claim 9, wherein performing the co-implanted ion implantation process includes implanting the substrate with implant including nitrogen, fluorine, carbon, or combinations thereof.

15. The method of claim 9, further comprising, after completion of the lightly doped source/drain implantation process, forming spacers adjacent to the gate stack.

16. The method of claim 9, wherein the co-implanted ion implantation process is performed by an ion implanter with a Cyro function.

17. A method of forming MOS transistors comprising:
performing a pocket implantation process on a substrate having a gate stack thereon at a temperature not less than about room temperature;
forming a lightly doped source/drain (LDD) region by:
performing a co-implanted ion implantation process with a diffusion-slowing dopant to form amorphous regions in the substrate, wherein the co-implanted ion implantation process is performed at a temperature ranging between about −100° C. and about 0° C., and
performing a lightly doped source/drain implantation process on the amorphous regions at a temperature not less than about room temperature; and
forming source and drain regions, following completion of the lightly doped source/drain implantation process, in the substrate, adjacent the gate stack, wherein a pre-amorphisation implantation process is not performed before or after the steps of pocket implantation or lightly doped source/drain implantation;

wherein performing the co-implanted ion implantation process includes implanting the substrate with implant including nitrogen, fluorine, carbon, or combinations thereof.

18. The method of claim 1, wherein the co-implanted ion implantation process forms a trapping layer configured to prevent interstitial back flow in the substrate.

19. The method of claim 1, wherein the lightly doped source/drain implantation process is performed by an ion implant tilt process at a tilt angle between about 0 degrees and 30 degrees.

20. The method of claim 1, wherein substantially equivalent implant energies are used for the pocket implantation process and the co-implanted ion implantation process.

* * * * *